United States Patent [19]

Fraser et al.

[11] 4,039,698
[45] Aug. 2, 1977

[54] METHOD FOR MAKING PATTERNED PLATINUM METALLIZATION

[75] Inventors: David Bruce Fraser; Alfred Urquhart MacRae, both of Berkeley Heights, N.J.

[73] Assignee: Bell Telephone Laboratories, Incorporated, Murray Hill, N.J.

[21] Appl. No.: 651,641

[22] Filed: Jan. 23, 1976

[51] Int. Cl.² ............................................. H05K 1/00
[52] U.S. Cl. ........................................ 427/34; 427/43; 427/96; 427/99; 427/88; 427/125; 427/229; 204/192 R; 204/192 EC; 96/36.2
[58] Field of Search .................... 427/43, 53, 96, 99, 427/259, 271, 272, 282, 229, 125, 34, 88; 96/36.2; 204/192 R, 192 C, 192 EC, 96, 99, 229

[56] References Cited

U.S. PATENT DOCUMENTS

| 3,117,023 | 1/1964 | Tirrell .............................. 427/229 X |
| 3,451,813 | 6/1969 | Kinney et al. ......................... 96/36.2 |
| 3,630,768 | 12/1971 | Bianchi et al. .................... 427/229 X |
| 3,930,963 | 1/1976 | Polichette et al. ............... 96/36.2 X |

Primary Examiner—Ralph S. Kendall
Attorney, Agent, or Firm—Peter V. D. Wilde

[57] ABSTRACT

A method is disclosed for making precisely patterned platinum films in the manufacture of integrated circuit devices. The method calls for the deposition of a film of a platinum compound, whose heat of formation is in the range of from −100 to +10 Kcal/mole, patterning the film, and thermally reducing the patterned film to platinum metal.

10 Claims, 1 Drawing Figure

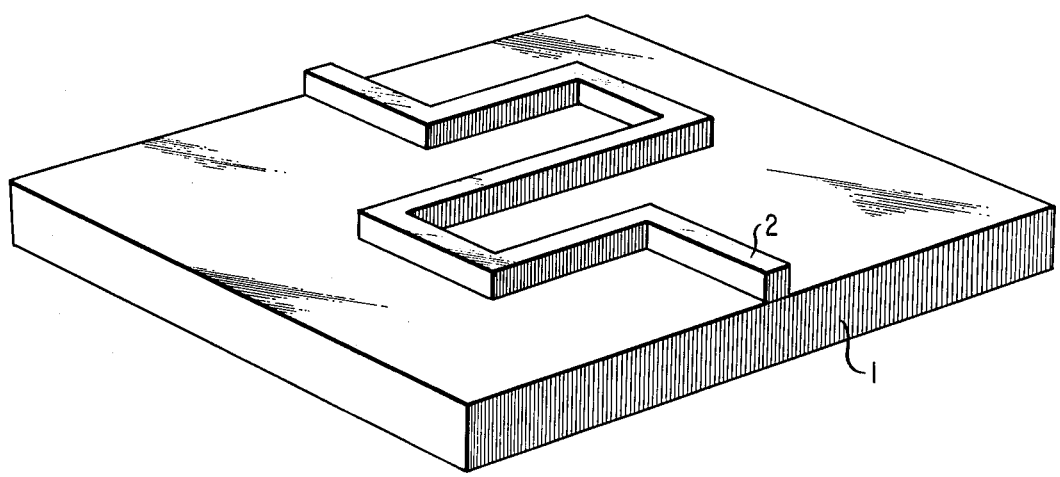

METHOD FOR MAKING PATTERNED PLATINUM METALLIZATION

BACKGROUND OF THE INVENTION

1. Field of the Invention

The invention is concerned with the fabrication of integrated circuits.

2. Description of the Prior Art

Integrated circuit technology is largely dependent on methods for depositing metallic films on substrates and for patterning such films. Substrates typically consist of electrically insulating materials such as alumina or glass. Film deposition and film patterning are typically carried out as separate, consecutive steps and may be applied repeatedly to deposit layer upon layer of different metallic films in the manufacture of an integrated circuit device.

Films may be deposited, for example, by vacuum deposition and the pattern may be made by selective exposure of the deposited film to a chemical etchant which is typically accomplished by applying a mask to the film prior to its exposure to the etchant.

A difficulty which arises primarily with the etching of noble metals lies in the tendency of etchants such as aqua regia to locally detach the mask from the film which, in turn, leads to poor pattern delineation.

One method designed to overcome this difficulty is disclosed in U.S. Pat. No. 3,451,813, issued to L. C. Kinney et al. on June 24, 1969. Using a binder, Kinney coats the substrate with a photoflash sensitive metal compound such as silver oxide, copper oxide, or nickel formate, places a transparency mask on the coated substrate and exposes the resulting assembly to a flash of light to reduce the exposed portions of the coating to elemental metal. Alternatively, a metallic powder such as copper powder or platinum powder may be deposited on the substrate followed by fusing the metallic particles into a coherent layer by photoflash.

SUMMARY OF THE INVENTION

The invention is a method for making a precisely patterned layer of platinum on a substrate. The method calls for depositing on the substrate a platinum compound whose heat of formation is in the range of from $-100$ to $+10$ Kcal/mole, patterning the deposited compound and thermally reducing to platinum metal the portions of the layer remaining after patterning.

BRIEF DESCRIPTION OF THE DRAWING

The FIGURE is a perspective view of a device comprising a patterned platinum film formed on a substrate by the claimed method.

DETAILED DESCRIPTION

1. The FIGURE

The FIGURE is a perspective view showing substrate 1 and patterned platinum layer 2.

2. The Method

The claimed method can be used to deposit a patterned platinum film on any substrate currently in use in integrated circuit technology, in particular on a substrate of alumina, glass, silicon or gallium arsenide. The substrate on which the deposit is to be made should be free of surface contamination. This may be assured by standard cleaning procedures using acid, organic solvents, and pure water rinses. After cleaning, the substrate may be dried, for example, by spin drying in air or by exposure to a stream of nitrogen. On the cleaned and dried substrate a layer of a platinum compound is deposited whose heat formation is in the range of from $-100$ to $+10$ Kcal/per mole. Compounds having a heat of formation below $-100$ Kcal/mole are undesirable because of the difficulty in heat reducing such compounds without damage to the substrate; compounds having a heat of formation in excess of approximately $+10$ Kcal/mole are too unstable to allow processing at ambient temperature and pressure. Examples of compounds suitable for the purpose of the invention are $Pt_3O_4$, Pt Cl, $PtI_4$, and PtBr whose heats of formation, according to Technical Note 270-4, U.S. Department of Commerce, May, 1969, pages 96-102, are $-39$, $-9$, $-17.4$, and $-11$ Kcal/mole, respectively.

The more stable platinum compounds may be deposited by reactive sputtering in standard diode sputtering apparatus having a platinum cathode and an anode supporting the substrate during processing. To deposit the more volatile compounds a magnetron type sputtering apparatus is preferably used to prevent dissociation of the compound being deposited by the flux of charged particles from the cathode to the substrate. Alternative methods of depositing are by plasma deposition or by brushing or spraying of a solution of the platinum compound, preferably in the presence of an organic resin binder.

The thickness of the deposit should preferably be at least 0.01 micrometers to ensure uniform coverage; thicknesses in excess of 5 micrometers are wasteful of raw materials. Following deposition, the layer of platinum compound is patterned by chemical etching, sputter etching with a suitable sputter gas such as argon, ion milling, or plasma etching in the presence of an appropriate mask. The mask may be made by depositing a suitable radiation sensitive resist on the layer of platinum compound followed by exposure of the resist to light, X-rays, or electrons. After patterning, the remnants of the mask are removed by standard means such as chemical solvents or exposure to an oxygen plasma. Finally, the patterned layer is reduced to elemental platinum by heating, preferably in a vacuum or a reducing atmosphere such as hydrogen. The temperature at which the reduction is carried out is dependent on the platinum compound to be reduced, on the atmosphere used, and also on the substrate. Generally, speaking, the temperature should preferably be at least 100° C for the sake of an adequate reaction rate. To prevent heat damage to the substrate, the reaction temperature preferably should not exceed 500° C. Depending on the thickness of the layer being reduced and also depending on the temperature, the reduction may take only a few minutes or require several hours.

EXAMPLE 1

A layer of platinum oxide 0.6 micrometers thick was deposited on a silicon substrate by sputter deposition using essentially pure oxygen as sputter gas. A standard negative photoresist was applied on the platinum oxide layer and a pattern requiring a resolution of $5\mu$ m was created photographically in the photoresist. The pattern was transferred to the platinum oxide layer by sputter etching with argon. The final reduction to platinum was carried out by heating in hydrogen at a temperature of 350° C for 20 minutes.

EXAMPLE 2

A layer of platinum chloride is deposited by sputtering Pt with chlorine gas. After a photoresist mask is deposited on the platinum chloride layer, the pattern is wet etched by rinsing in water. The remainder of the mask is stripped in an oxygen plasma and the resulting platinum chloride pattern reduced to metallic platinum by heating at 200° C in hydrogen for 15 minutes.

In both instances, well-adhering, precisely delineated patterns are obtained.

What is claimed is:

1. A method for making a patterned layer of platinum metal on a substrate comprising the steps of depositing on said substrate a first layer, depositing on said first layer and a second layer of a resist material, patterning said second layer by selectively removing portions of said resist material and thereby exposing portions of said first layer, patterning said first layer by physically removing the exposed portions of said first layer, and removing the remaining portions of said second layer CHARACTERIZED IN THAT (1) said first layer is platinum oxide and (2) after removing the exposed portions of said first layer the remaining portions of said first layer are heat reduced to platinum metal.

2. Method of claim 1 in which said layer of platinum compound is deposited in a thickness in the range of from 0.01 micrometer to 5.0 micrometers.

3. Method of claim 1 in which said platinum compound is deposited by reactive sputtering.

4. Method of claim 1 in which said platinum compound is deposited by plasma deposition.

5. Method of claim 1 in which said platinum compound is applied in solution.

6. Method of claim 1 in which said patterning is carried out by chemical etching.

7. Method of claim 1 in which said patterning is carried out by sputter etching.

8. Method of claim 1 in which said patterning is performed by ion milling.

9. Method of claim 1 in which said patterning is carried out by plasma etching.

10. Method of claim 1 in which said patterned platinum compound layer is heat reduced to platinum metal at a temperature in the range of from 100° C to 500° C.

* * * * *